US012772786B2

(12) United States Patent
Hong et al.

(10) Patent No.: US 12,772,786 B2
(45) Date of Patent: Oct. 20, 2026

(54) SUBSTRATE TRANSFER UNIT AND SUBSTRATE TREATMENT APPARATUS INCLUDING THE SAME

(71) Applicant: SEMES CO., LTD., Chungcheongnam-do (KR)

(72) Inventors: Nam Ki Hong, Chungcheongnam-do (KR); Eun Ju Lee, Chungcheongnam-do (KR); Gui Hun Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 753 days.

(21) Appl. No.: 18/129,082

(22) Filed: Mar. 31, 2023

(65) Prior Publication Data

US 2024/0162070 A1 May 16, 2024

(30) Foreign Application Priority Data

Nov. 10, 2022 (KR) ........................ 10-2022-0149312

(51) Int. Cl.
*H01L 21/677* (2006.01)
*B25J 11/00* (2006.01)
(Continued)

(52) U.S. Cl.
CPC ....... *H10P 72/3202* (2026.01); *B25J 11/0095* (2013.01); *H10P 72/3206* (2026.01); *H10P 72/7602* (2026.01)

(58) Field of Classification Search
CPC .......... H01L 21/67742; H01L 21/68707; B25J 19/0058
See application file for complete search history.

(56) References Cited

U.S. PATENT DOCUMENTS

2009/0255362 A1* 10/2009 Barker .............. H01L 21/67742 901/23
2022/0270912 A1* 8/2022 Ide .................... H01L 21/67178

FOREIGN PATENT DOCUMENTS

JP 4-106336 4/1992
KR 10-2001-0053870 7/2001
(Continued)

OTHER PUBLICATIONS

Office Action dated Jun. 17, 2024 for Korean Patent Application No. 10-2022-0149312 and its English translation from Global Dossier.

*Primary Examiner* — Karla A Moore
*Assistant Examiner* — Nathan K Ford
(74) *Attorney, Agent, or Firm* — WOMBLE BOND DICKINSON (US) LLP

(57) ABSTRACT

A substrate transfer unit is provided. The substrate transfer unit includes: a rail part having a length in a horizontal direction; a vertical part moving along the rail part, guiding the vertical movement of a robot, which transfers a substrate, and having, formed therein, first flow paths that a fluid is introduced into and passes through; main duct parts having, formed therein, second flow paths which communicate with the first flow paths, having first end portions connected to the vertical part, and including outlets, which are formed at second end portions of the main duct parts and face a bottom surface of the index module, and through holes, which are formed on one or both sides of each of the second end portions; and auxiliary duct parts surrounding the through holes at the second end portions of the main duct parts and having, formed therein, expansion spaces which communicate with the second flow paths.

20 Claims, 10 Drawing Sheets

(51) Int. Cl.

| | |
|---|---|
| ***H01L 21/687*** | (2006.01) |
| ***H10P 72/30*** | (2026.01) |
| ***H10P 72/76*** | (2026.01) |

(56) References Cited

FOREIGN PATENT DOCUMENTS

| | | |
|---|---|---|
| KR | 10-2014-0102366 | 8/2014 |
| KR | 10-2017-0055819 | 5/2017 |

* cited by examiner

[FIG. 1]
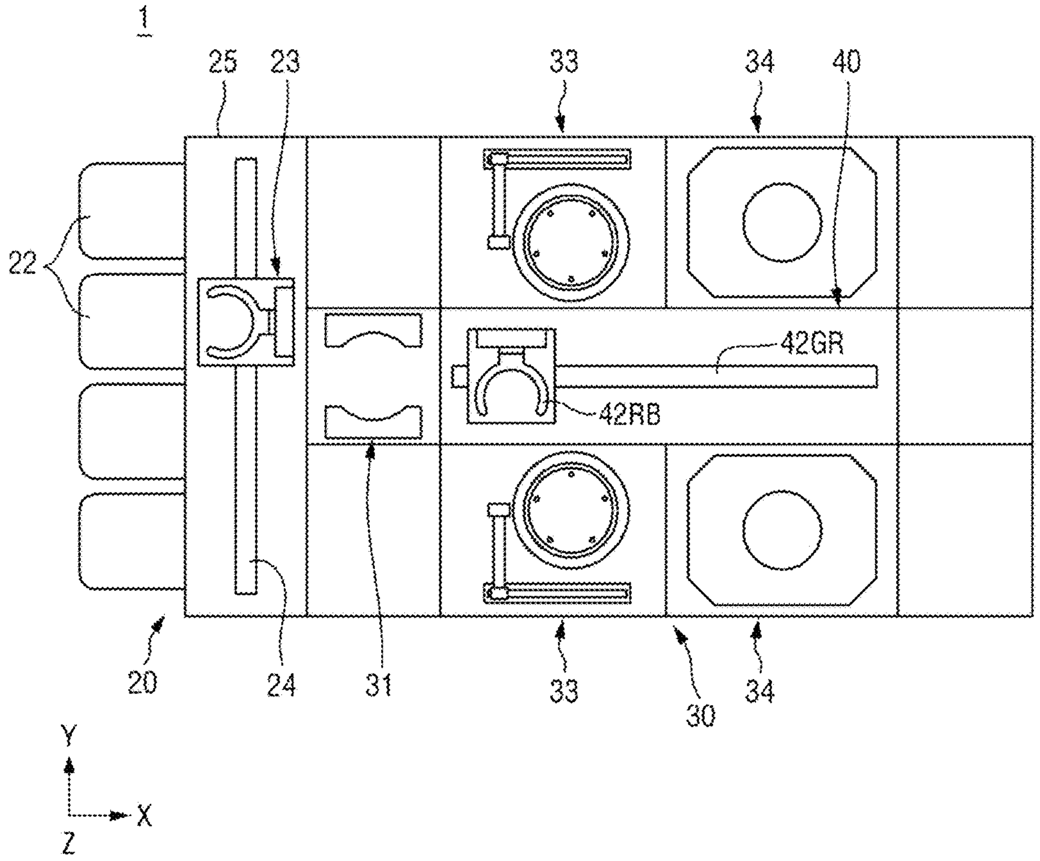

[FIG. 2]
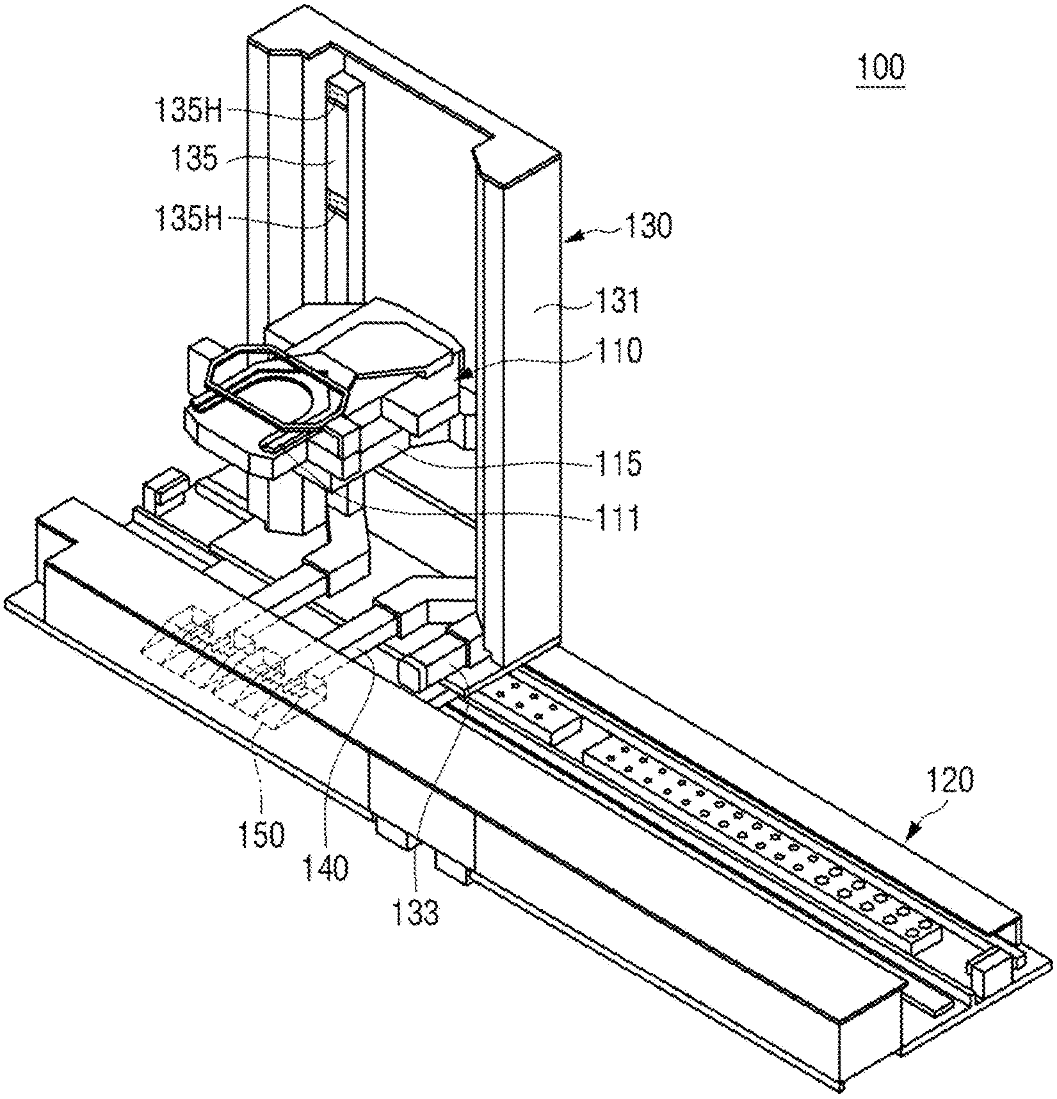

[FIG. 3]
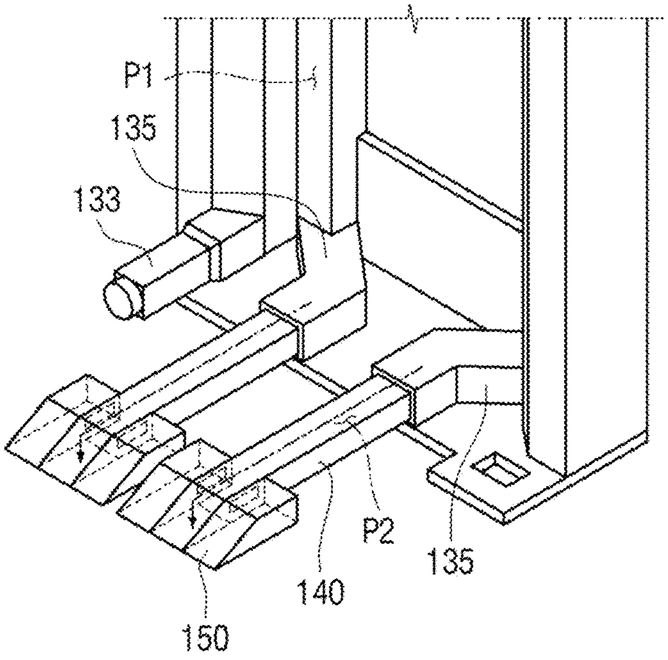

[FIG. 4]
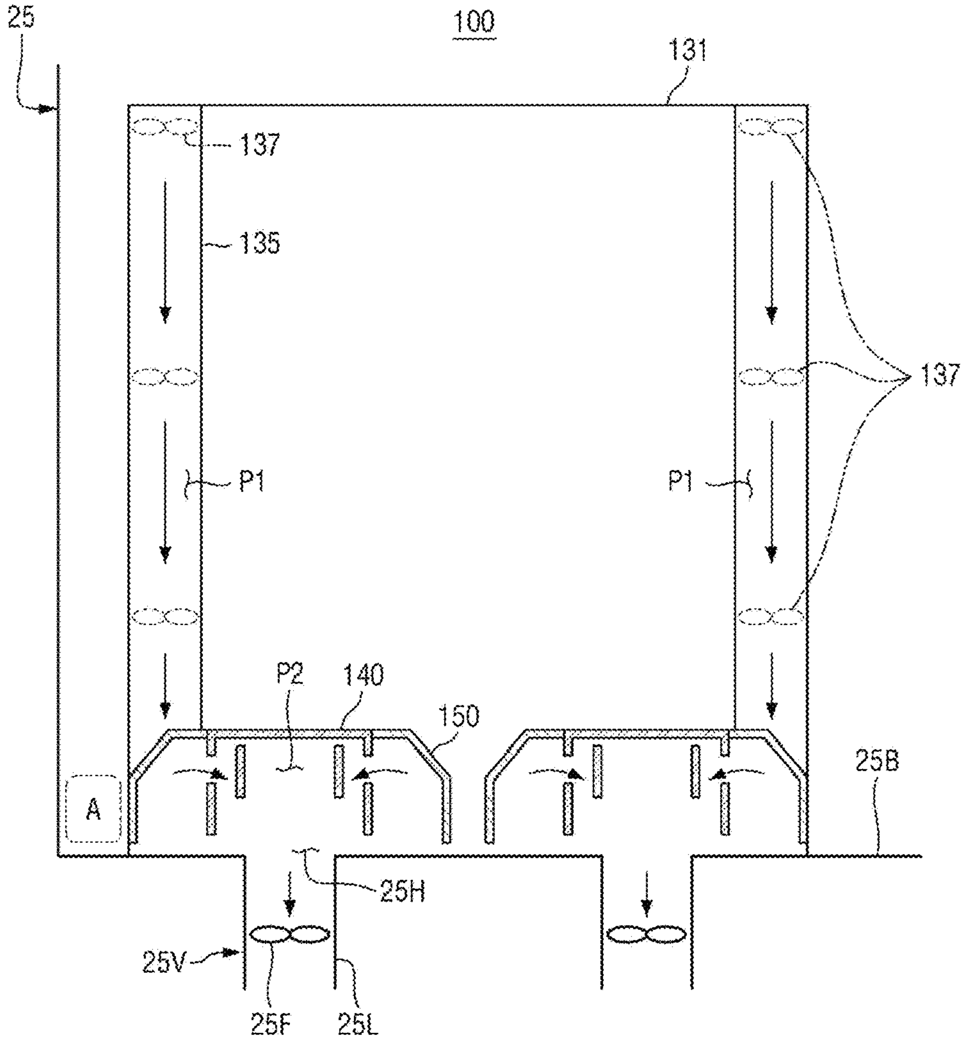

[FIG. 5]
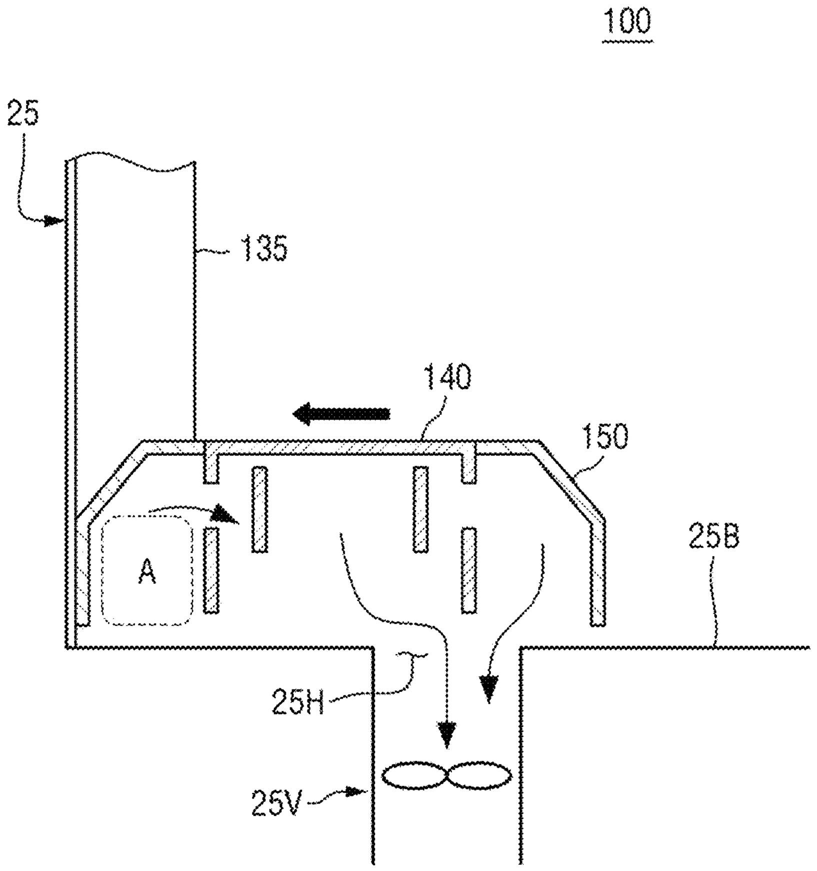

[FIG. 6]
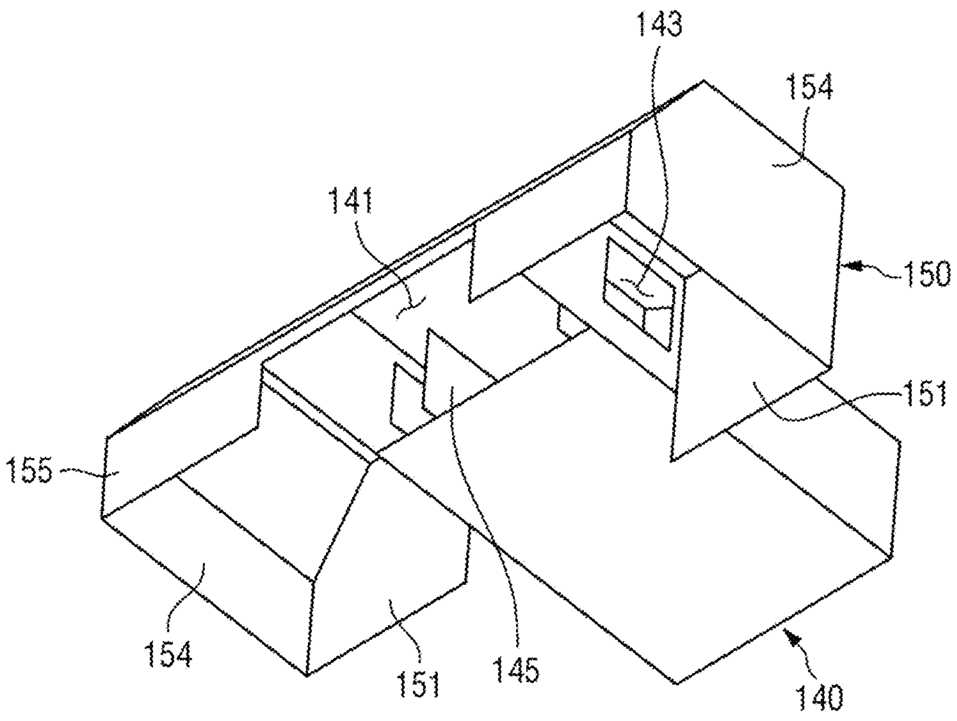

[FIG. 7]
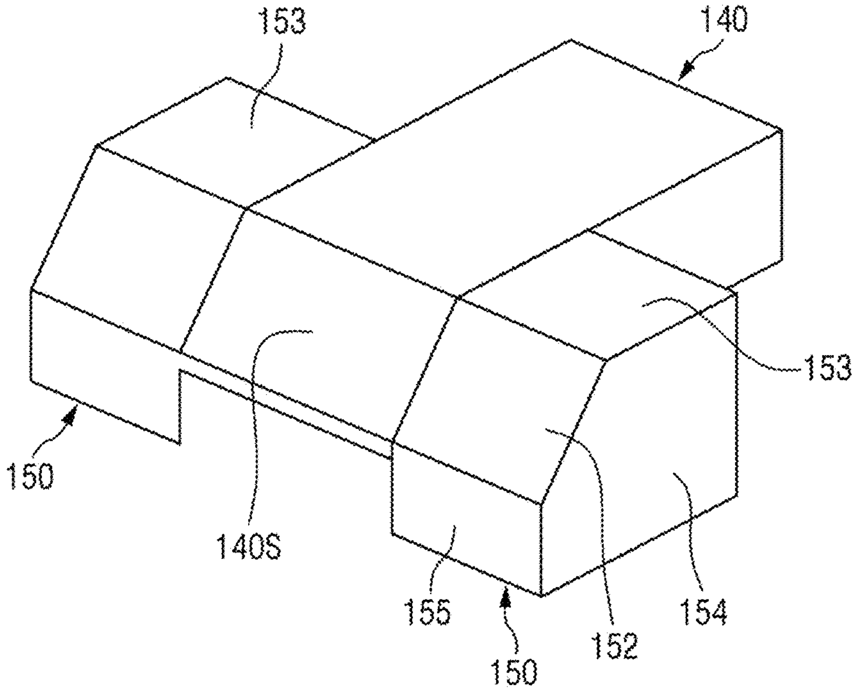

[FIG. 8]
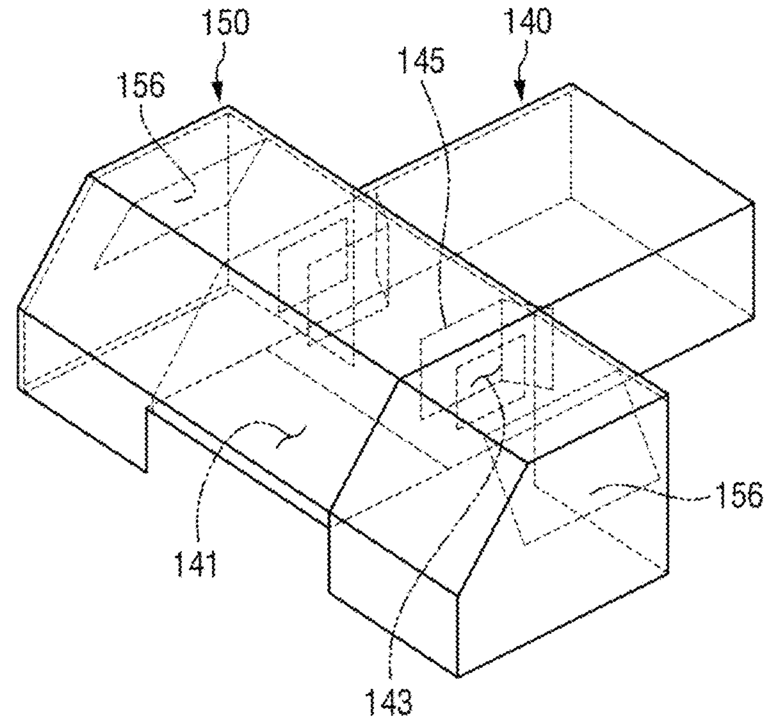

[FIG. 9]
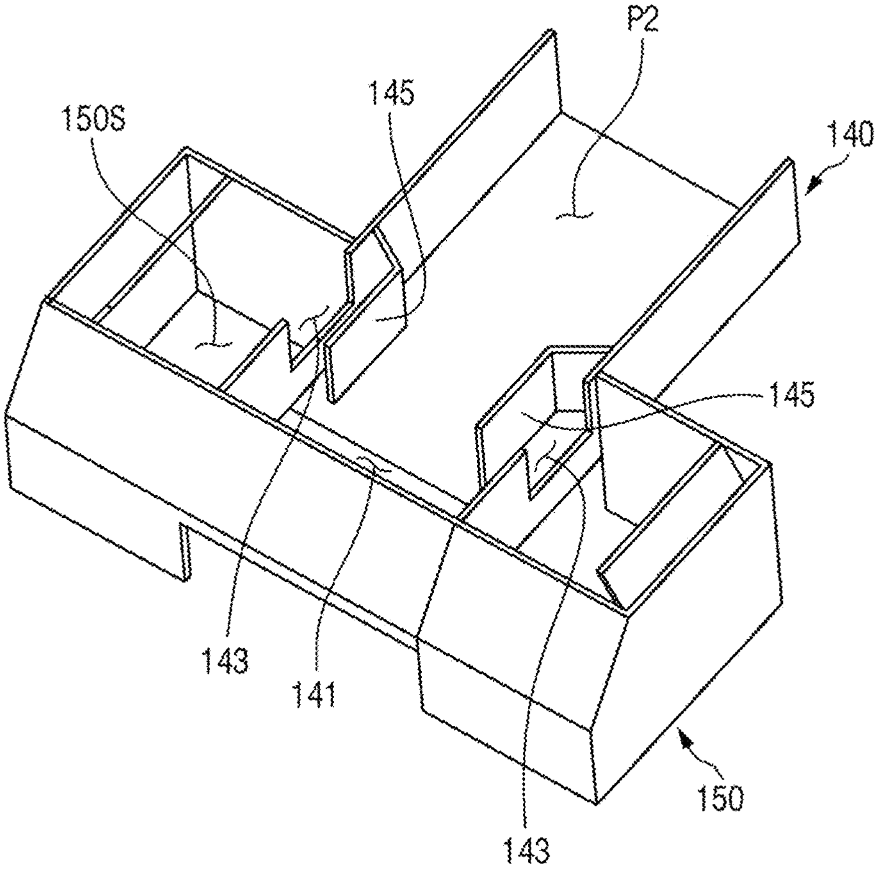

[FIG. 10]
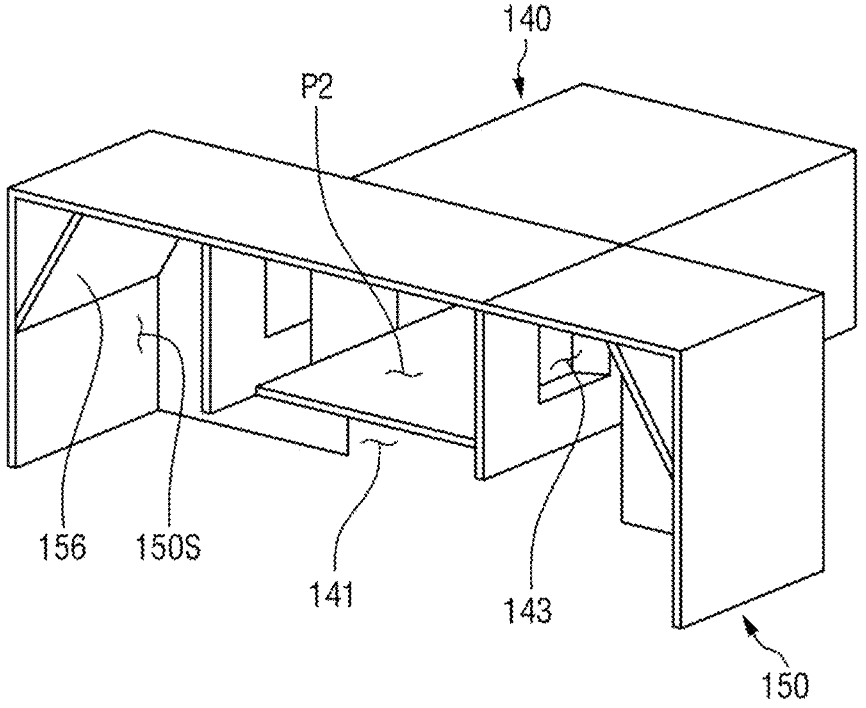
[FIG. 11]
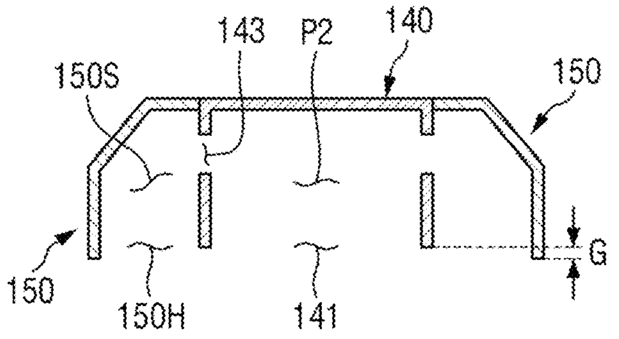

SUBSTRATE TRANSFER UNIT AND SUBSTRATE TREATMENT APPARATUS INCLUDING THE SAME

CROSS-REFERENCE TO RELATED APPLICATION

This application claims priority from Korean Patent Application No. 10-2022-0149312 filed on Nov. 10, 2023 in the Korean Intellectual Property Office, and all the benefits accruing therefrom under 35 U.S.C. 119, the contents of which in its entirety are herein incorporated by reference.

BACKGROUND

1. Field

The present disclosure relates to a substrate transfer nit and a substrate treatment apparatus including the same.

2. Description of the Related Art

Integrated circuit devices such as semiconductor devices may be obtained by performing processes such as a thin film process, an etching process, a cleaning process, and a drying process, and a transfer process for transferring substrates to be fabricated into such integrated circuit devices between unit processes may be performed. In the transfer process, substrate transfer units having various structures may be used.

Meanwhile, an airflow may be generated around a robot of a substrate transfer unit when the robot is moving vertically or horizontally. Particularly, if an airflow generated at the bottom moves upward in accordance with the movement of the robot, foreign substances in the airflow may undesirably settle on substrates, resulting in defects, and this needs to be addressed.

SUMMARY

Aspects of the present disclosure provide a substrate transfer unit capable of reducing defects in substrates and a substrate treatment apparatus including the substrate transfer unit.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a substrate transfer unit includes: a rail part having a length in a horizontal direction; a vertical part moving along the rail part, guiding the vertical movement of a robot, which transfers a substrate, and having, formed therein, first flow paths that a fluid is introduced into and passes through; main duct parts having, formed therein, second flow paths which communicate with the first flow paths, having first end portions connected to the vertical part, and including outlets, which are formed at second end portions of the main duct parts and face downward, and through holes, which are formed on one or both sides of each of the second end portions; and auxiliary duct parts surrounding the through holes at the second end portions of the main duct parts and having, formed therein, expansion spaces which communicate with the second flow paths.

According to another aspect of the present disclosure, a substrate treatment apparatus includes: an index module; one or more treatment modules into which a substrate is introduced from the index module to be treated; and a transfer module transferring the substrate between the treatment modules, wherein at least one of the index module and the transfer module includes a substrate transfer unit, and the substrate transfer unit includes a rail part having a length in a horizontal direction, a vertical part moving along the rail part, guiding the vertical movement of a robot, which transfers the substrate, and having, formed therein, first flow paths that a fluid is introduced into and passes through, main duct parts having, formed therein, second flow paths which communicate with the first flow paths, having first end portions connected to the vertical part, and including outlets, which are formed at second end portions of the main duct parts and face a bottom surface of the index module, and through holes, which are formed on one or both sides of each of the second end portions, and auxiliary duct parts surrounding the through holes at the second end portions of the main duct parts and having, formed therein, expansion spaces which communicate with the second flow paths.

According to another aspect of the present disclosure, a substrate transfer unit includes: a robot transferring a substrate; a rail part having a length in a horizontal direction; a vertical part moving along the rail part, guiding the vertical movement of the robot, having, formed therein, first flow paths that a fluid is introduced into and passes through, and having, provided therein, one or more fans which generate downward airflows; main duct parts having, formed therein, second flow paths which communicate with the first flow paths, having first end portions connected to the vertical part, and including outlets, which are formed at second end portions of the main duct parts and face a bottom surface of the index module, through holes, which are formed on one or both sides of each of the second end portions, and screens, which face the through holes at the rear of the outlets, extend from inner side surfaces of the main duct parts toward the front of the main duct parts, and are bent such that spaces are formed between the screens and the through holes and that the width of the second flow paths is reduced; and auxiliary duct parts surrounding the through holes at the second end portions of the main duct parts, having, formed therein, expansion spaces which communicate with the second flow paths, and having openings formed at lower parts thereof, adjacent to the outlets of the main duct parts, wherein the auxiliary duct parts include first surfaces, which are connected to the main duct parts and are provided at the rear of the auxiliary duct parts, second surfaces, which are connected to the main duct parts and are provided at the front of the auxiliary duct parts to face the first surfaces, third surfaces, which are connected to the main duct parts, connect the first surfaces and the second surfaces, and form top surfaces of the auxiliary duct parts, fourth surfaces, which are connected to the first surfaces, the second surfaces, and the third surfaces and face the through holes, and inclined plates, which face the through holes and are downwardly inclined in directions from the main duct parts to the auxiliary duct parts, and the first surfaces and the fourth surfaces of the auxiliary duct parts extend downwardly below lower ends of the main duct parts.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a schematic view of a substrate treatment apparatus according to some embodiments of the present disclosure;

FIG. 2 is a perspective view of a substrate transfer unit according to some embodiments of the present disclosure;

FIG. 3 is a perspective view illustrating main duct parts and auxiliary duct parts of the substrate transfer unit of FIG. 2;

FIG. 4 is a schematic view illustrating how outlets of the main duct parts are positioned to face exhaust holes;

FIG. 5 is a schematic view illustrating the substrate transfer unit of FIG. 2 with a vertical part moved;

FIG. 6 is a perspective view of part of a substrate transfer unit according to an embodiment of the present disclosure, as viewed from therebelow;

FIG. 7 is a perspective view of part of the substrate transfer unit of FIG. 6, as viewed from thereabove;

FIG. 8 is a perspective view illustrating the internal structure of the substrate transfer unit of FIG. 6;

FIG. 9 is a perspective view of a main duct part of the substrate transfer unit of FIG. 6 with a top surface removed;

FIG. 10 is a perspective view of a main duct part of the substrate transfer unit of FIG. 6 with a front surface removed; and FIG. 11 is a cross-sectional view illustrating a main duct part and auxiliary duct parts of the substrate transfer unit of FIG. 6.

DETAILED DESCRIPTION

Preferred embodiments of the present disclosure will be described in detail with reference to the accompanying drawings. The present disclosure and methods of accomplishing the same may be understood more readily by reference to the following detailed description of embodiments and the accompanying drawings. However, the present disclosure may be embodied in many different forms, and should not be construed as being limited to the embodiments set forth herein. Rather, these embodiments are provided so that this disclosure will be through and complete and will fully convey the concept of the invention to those skilled in the art, and the present disclosure will only be defined by the appended claims. Like reference numbers designate like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a schematic view of a substrate treatment apparatus according to some embodiments of the present disclosure. Referring to FIG. 1, a substrate treatment apparatus 1 may include an index module 20, a treatment module 30, and a transfer chamber 40.

The index module 20 may transfer a container (e.g., a front open unified pod (FOUP)) including substrates to the treatment module 30 and may load substrates that have been treated in a container.

For example, the index module 20 may include load ports 22 and an index robot 23. A container in which substrates are accommodated may be placed in each of the load ports 22.

The index robot 23 may be provided to be movable along a guide rail 24, which is provided in a Y-axis direction. The index robot 23 and a transfer robot 42RB of the transfer chamber 40 are named separately, but may have the same (or similar) operating principles and shape. A well-known mechanism may be applicable to the index robot 23 and the transfer robot 42RB.

The treatment module 30 may include a buffer chamber 31, a wet treatment chamber 33, and a supercritical chamber 34, but the present disclosure is not limited thereto.

The buffer chamber 31 may be provided between the index module 20 and the transfer chamber 40, but the present disclosure is not limited thereto. The buffer chamber 31 may store a plurality of substrates together. The substrates stored in the buffer chamber 31 may be carried in and out of the buffer chamber 31 by the index robot 23 and the transfer robot 42RB.

The wet treatment chamber 33 may treat liquid films on substrates. For example, the wet treatment chamber 33 may perform a cleaning process on substrates, thereby cleaning patterned surfaces of the substrates. A treatment liquid released from the wet treatment chamber 33 may include a chemical, pure water (or deionized water (DIW)), and an organic solvent (e.g., isopropyl alcohol: IPA)).

The supercritical chamber 34 may be provided near the wet treatment chamber 33. The supercritical chamber 34 may treat substrates by supplying a supercritical fluid to the substrates. For example, the supercritical chamber 34 may supply a supercritical fluid to substrates treated by the wet treatment chamber 33 and may thus dry the substrates. In other words, the supercritical chamber 34 may dry an organic solvent that remains on substrates.

The transfer chamber 40 may transfer substrates between the wet treatment chamber 33 and the supercritical chamber 34. The transfer chamber 40 may be provided in an X-axis direction. The transfer robot 42RB may be provided in the transfer chamber 40. A guide rail 42GR may be provided in the transfer chamber 40 in the X-axis direction, and the transfer robot 42RB may be provided to be movable on the guide rail 42GR.

A substrate transfer unit 100 may be provided in the index module 20 or the transfer chamber 40. The substrate transfer unit 100 will hereinafter be described as being provided in the index module 20.

In other words, a robot 110 of the substrate transfer unit 100 may be provided as the index robot 23 or the transfer robot 42RB. The robot 110 of the substrate transfer unit 100 will hereinafter be described as being the index robot 23.

A rail part 120 of the substrate transfer unit 100 may be provided as the guide rail 24 of the index module 20 or the guide rail 42GR of the transfer chamber 40. The rail part 120 of the substrate transfer unit 100 will hereinafter be described as being provided as the guide rail 24.

FIGS. 2 through 5 illustrate a substrate transfer unit according to some embodiments of the present disclosure. FIGS. 6 through 11 illustrate a main duct part and an auxiliary duct part of the substrate transfer unit according to some embodiments of the present disclosure.

Referring to FIGS. 2 through 11, the substrate transfer unit 100 may be provided in a housing 25 and may include the robot 110, the rail part 120, a vertical part 130, main duct parts 140, and auxiliary duct parts 150.

The housing 25 may form the exterior of the index module 20 and may accommodate the substrate transfer unit 100 therein. The housing 25 may have a box shape with an accommodation space formed therein. The box structure may consist of frames and plates, but the present disclosure is not limited thereto.

Exhaust holes 25H may be formed in the housing 25 of the index module 20 to release internal air (hereinafter referred to as the fluid or the internal air of the index module 20) to the outside. Referring to FIG. 4, the exhaust holes 25H may be formed near a sidewall of the housing 25, but the present disclosure is not limited thereto. The exhaust holes 25H may be positioned in the middle, in the Y-axis direction, of the index module 20.

The exhaust holes 25H may be formed to penetrate a bottom surface 25B of the index module 20. Exhaust units 25V may be installed in the exhaust holes 25H such that the internal air of the index module 20 may be forcibly exhausted to the outside. The exhaust units 25V may include exhaust lines 25L and first fans 25F.

The exhaust lines 25L may be connected to the exhaust holes 25H and may communicate with second flow paths P2 depending on the location of the main duct parts 140. The first fans 25F may be provided in the exhaust lines 25L and may forcibly discharge the fluid by generating airflows from the index module 20 to the outside. The exhaust holes 25H may communicate with outlets 141 of the main duct parts 140 such that the exhaust lines 25L and the second flow paths P2 may communicate with one another. The first fans 25F may not be provided depending on the structure and space in which the first fans 25F are to be installed.

The robot 110 may transfer substrates. If the robot 110 is provided as the index robot 23, a door opener capable of opening the doors of containers may be provided. The robot 110 may pick up and place substrates.

The robot 110 may be provided in the vertical part 130, which moves along the rail part 120, and may be horizontally movable in the Y-axis direction in accordance with the movement of the vertical part 130. The robot 110 may be configured to be vertically movable in the vertical part 130, but the present disclosure is not limited thereto.

For example, the robot 110 may include one or more hands 111 and a pedestal 115. For example, a plurality of hands 111 may be provided to be vertically spaced apart from one another. Each of the hands 111 may be provided in a shape with one side open and may provide the bottom edges of each substrate. The hands 111 may be provided to be movable back and forth in the X-axis direction and to be rotatable about a Z-axis direction. For example, the operation of the hands 111 may be implemented by an actuator such as a motor and/or a cylinder and a gear module.

The pedestal 115 may support the hands 111. The pedestal 115 may be provided in a block structure. The pedestal 115 may be installed in the vertical part 130 to be vertically movable so that the hands 111 may be movable in the Z-axis direction. The pedestal 115 may be provided with a driving device (not illustrated) such as a motor and may thus be movable along the rail part 120, but the present disclosure is not limited thereto.

The rail part 120, which is for guiding the sliding of the vertical part 130, may have a rail structure. The rail part 120 may have a length in the Y-axis direction.

The vertical part 130 may include a frame 131, a motor, columns 135, and second fans 137, may guide the vertical movement of the robot 110, and may be movable along the rail part 120.

The robot 110 may be movably provided on the frame 131 or on the columns 135. For example, a rail structure that is the same as, or similar to, the rail part 120 may be provided on the frame 131 or on the columns to guide the vertical movement of the robot 110, but the present disclosure is not limited thereto.

The frame 131 may form a rectangular shape and may be provided to be slidable on the rail part 120. For example, the frame 131 may be provided with a driving belt (not illustrated) and/or a gear module (not illustrated) (e.g., rack and pinion gears).

The motor 133 may be installed on the frame 131 to transmit a rotational force to the driving belt and/or the gear module of the frame 131 and thus to move the frame 131 in the Y-axis direction.

The columns 135 may be provided on both sides, in the Y-axis direction, of the frame 131. Spaces may be formed inside the columns 135. That is, first flow paths P1 may be formed in the columns 135. A plurality of holes 135H may be formed in each of the columns 135 near the second fans 137 and may be vertically spaced apart from one another. The internal air of the index module 20 may be introduced into the columns 135 through the holes 135H. The internal air of the index module 20 may be introduced into the columns 135 through the holes 135H by airflows generated by the second fans 137 of the vertical part 130.

One or more second fans 137 may be provided in each of the columns 135. The second fans 137 may generate downward airflows in directions from the first flow paths P1 to the second flow paths P2. Airflows may be generated from the rear to the front (i.e., the outlets 141) of the main duct parts 140 by the second fans 137 and the first fans 25F of the exhaust units 25V.

The main duct parts 140 may be connected to the vertical part 130 and may thus be movable together with the vertical part 130. The main duct parts 140 may have a tubular structure extending in the X-axis direction, and the outlets 141 of the main duct parts 140 may be positioned in the exhaust holes 25H. First end portions (e.g., rear end portions) of the main duct parts 140 may be connected to the vertical part 130, and the outlets 141 may be formed in second end portions (e.g., front end portions) of the main duct parts 140 to face the bottom surface 25B.

As the main duct parts 140 are formed to be hollow, the second flow paths P2, which communicate with the first flow paths P1, may be formed. The internal air of the index module 20 may be discharged to the outside through the exhaust holes 25H, which are formed at the bottom surface 25B of the index module 20, through the first flow paths P1 and the second flow paths P2.

One or more through holes 143 may be formed on one or both sides of each of the second end portions of the main duct parts 140 such that the main duct parts 140 may communicate with the auxiliary duct parts 150. The through holes 143 will hereinafter be described as being formed on both sides of each of the main duct parts 140.

The through holes 143 may be positioned at the rear of the outlets 141. The main duct parts 140 may also include screens 145. The screens 145 may face the through holes 143 and may guide the fluid passing through the second flow paths P2.

The screens 145, which face the through holes 143, may extend from inner side surfaces of the main duct parts 140 toward the front of the main duct parts 140 and may be bent. That is, the screens 145 may be provided such that spaces may be formed between the screens 145 and the through holes 143 and the width of the second flow paths P2 may be reduced without blocking the through holes 143.

Also, the screens 145 may guide the fluid toward the outlets 141 when discharging the fluid from expansion spaces 150S to the main duct parts 140. Also, the screens 145 may reduce the cross-sectional area of the second flow paths P2 at the second end portions of the main duct parts 140, while guiding the fluid in the second flow paths P2 toward the outlets 141. That is, the screens 145 may form negative pressure in accordance with the Bernoulli effect. Accordingly, airflows from the second flow paths P2 toward the outlets 141 can be further facilitated.

Inclined surfaces 140S may be provided at the second end portions of the main duct parts 140. The inclined surfaces 140S may be inclined from the rear to the front of the main duct parts 140. That is, parts of the top surfaces of the main duct parts 140 that face the outlets 141 may be provided as downwardly inclined surfaces 140S so that the fluid passing through the second flow paths P2 may be guided in a downward direction by the inclined surfaces 140S.

The auxiliary duct parts 140 may surround the through holes 143 at the second end portions of the main duct parts 140, thereby forming the expansion spaces 150S, which communicate with the second flow paths P2. The expansion spaces 150S may be provided to form spaces that are expanded to the ends of the vertical part 130, as illustrated in FIGS. 4 and 5.

The auxiliary duct parts 150 may form openings 150H at the bottoms thereof, near the outlets 141 of the main duct parts 140. As the expansion spaces 150S are formed, the auxiliary duct parts 150 may have a box shape with the openings 150H formed at the bottoms thereof.

The auxiliary duct parts 150 may include first surfaces 151, second surfaces 152, third surfaces 153, fourth surfaces 154, fifth surfaces 155, and inclined plates 156.

The first surfaces 151 may be connected to the main duct parts 140 and may be provided at the rear of the auxiliary duct parts 150. The first surfaces 141 and the fourth surfaces 154 may extend downwardly beyond the lower ends of the main duct parts 140. That is, referring to FIG. 11, a step difference G may be formed between the lower ends of the auxiliary duct parts 150 and the lower ends of the main duct parts 140. As a result, airflows may be generated toward the outlets 141 of the main duct parts 140, rather than toward the outside of the auxiliary duct parts 150. Also, as the expansion spaces 150S are provided on both sides of each of the second flow paths P2 and the openings 150H below the expansion spaces 150S and the outlets 141 have a step difference therebetween, circulation airflows may be provided. This will be described later.

The second surfaces 152 may be connected to the main duct parts 140 and may be provided at the front of the auxiliary duct parts 150 to be opposite to the first surfaces 151. The second surfaces 152 may form the same inclination as the inclined surfaces 140S of the main duct parts 140.

The third surfaces 153 may be connected to the main duct parts 140, may connect the first surfaces 151 and the second surfaces 152, and may form the top surfaces of the auxiliary duct parts 150. The fourth surfaces 154 may be connected to the first surfaces 151, the second surfaces 152, and the third surfaces 153 and may face the through holes 143. The fifth surfaces 155 may extend downwardly from the second surfaces 152, and the lower ends of the fifth surfaces 155 may have the same height as the lower ends of the first surfaces 151 and the lower ends of the fourth surfaces 154.

The inclined plates 156 may face the through holes 143 and may be downwardly inclined in directions from the main duct parts 140 to the auxiliary duct parts 150. As a result, upper parts of the expansion spaces 150S may be narrower lower parts of the expansion spaces 150S, and the fluid may be moved by being guided by the inclined plates 156.

The inclined plates 156 may be connected to the third surfaces 153 and the fourth surfaces 154. Referring to FIG. 8, the third surfaces 153 and the fourth surfaces 154 may be connected, and the inclined plates 156 may be added on the inside of the third surfaces 153 and the fourth surfaces 154. Alternatively, the third surfaces 153 and the fourth surfaces 154 may not be connected directly, but may be connected by the inclined plates 156.

The flow of the fluid will hereinafter be described with reference to FIGS. 4 and 5.

Referring to FIG. 4, as the second fans 137 are driven, downward airflows may be generated in the first flow paths P1 of the columns 135, and the fluid may move toward the second flow paths P2 along the first flow paths P1.

The fluid passing through the second flow paths P2 may be discharged into the exhaust lines 25L through the outlets 141 of the main duct parts 140. As the first fans 25F are provided in the exhaust lines 25L, the fluid may be forcibly discharged to the outside. However, even if the first fans 25F are not provided, the fluid can be easily discharged due to the Bernoulli effect.

Also, as airflows are generated in a direction toward the main duct parts 140 due to negative pressure resulting from the forcible discharge of the fluid or the Bernoulli effect, the fluid can be discharged to the outside after flowing to the main duct parts 140.

Referring to FIG. 5, the vertical part 130 may move to a sidewall of the index module 20. If the auxiliary duct parts 150 are not provided, a space A of FIG. 4 may be generated between the sidewall of the index module 20 and the main duct parts 140.

As the robot 110 moves vertically, an upward flow of the air around the bottom surface 25B of the index module 20 may be generated. If foreign substances in the air are moved to substrates by an upward airflow in the space the sidewall of the index module 20 and the main duct parts 140, particles may be formed on the substrates.

However, the space between the sidewall of the index module 20 and the main duct parts 140 may be at least partially covered by the auxiliary duct parts 150. Accordingly, even if foreign substances settle on the bottom surface 25B of the index module 20 around the space between the sidewall of the index module 20 and the main duct parts 140, the foreign substances may be released to the outside through the expansion spaces 150S of the auxiliary duct parts 150 and the main duct parts 140.

For example, even if the outlets 141 and the openings 150H do not face the exhaust holes 25H, the air can circulate, passing through the through holes 143 in the expansion spaces 150S and then being introduced back into the expansion spaces 150S due to the step difference G (of FIG. 11). This is because as the air in the second flow paths P2 circulates, flowing from the rear to the front without being stagnant, the air in the expansion spaces 150S can also flow without being stagnant.

Even if foreign substances are gathered in the space between the sidewall of the index module 20 and the main duct parts 140, the foreign substances can circulate within the auxiliary duct parts 150 due to the presence of the expansion spaces 150S and circulation airflows in the expansion spaces 150S. Then, referring to FIG. 4, the air can be released to the outside through the inlets 141 and the exhaust holes 25H if the inlets 141 (or the expansion spaces 150S) are placed to face the exhaust holes 25H.

Foreign substances have been described as being gathered, particularly, in the space between the sidewall of the index module 20 and the main duct parts 140, but the present disclosure is not limited thereto. That is, all foreign substances passing through the auxiliary duct parts 150 due to the circulation airflows in the expansion spaces 150S can be discharged to the outside after circulating within the auxiliary duct parts 150.

The substrate transfer unit 100 can minimize particle sources and can thus prevent the degradation of the quality of substrates.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. A substrate transfer unit comprising:

a rail part having a length in a horizontal direction;

a vertical part moving along the rail part, guiding the vertical movement of a robot, which transfers a substrate, and having, formed therein, first flow paths that a fluid is introduced into and passes through;

main duct parts having second flow paths formed therein that communicate with the first flow paths, having first end portions that are directly attached to the vertical part and that are inlets of the second flow paths that receive the fluid from the flow paths of the vertical part, having outlets that are formed at second end portions of the main duct parts and that face downward, and having through holes that are formed on one or both sides of each of the second end portions; and auxiliary duct parts surrounding the through holes at the second end portions of the main duct parts and having, formed therein, expansion spaces which communicate with the second flow paths.

2. The substrate transfer unit of claim 1, wherein the through holes are positioned at the rear of the outlets, and openings are formed at lower parts of the auxiliary duct parts, adjacent to the outlets of the main duct parts.

3. The substrate transfer unit of claim 2, wherein the auxiliary duct parts include first surfaces, which are connected to the main duct parts and are provided at the rear of the auxiliary duct parts, second surfaces, which are connected to the main duct parts and are provided at the front of the auxiliary duct parts to face the first surfaces, third surfaces, which are connected to the main duct parts, connect the first surfaces and the second surfaces, and form top surfaces of the auxiliary duct parts, and fourth surfaces, which are connected to the first surfaces, the second surfaces, and the third surfaces and face the through holes.

4. The substrate transfer unit of claim 3, wherein the second end portions of the main duct parts include inclined surfaces, which are downwardly inclined from the rear to the front of the main duct parts to guide the movement of a fluid passing through the second flow paths in a downward direction, and the second surfaces form the same inclination as the inclined surfaces.

5. The substrate transfer unit of claim 3, wherein the first surfaces and the fourth surfaces of the auxiliary duct parts extend downwardly below lower ends of the main duct parts.

6. The substrate transfer unit of claim 5, wherein the auxiliary duct parts further include fifth surfaces, which extend downwardly from the second surfaces and have the same is height at lower ends thereof as lower ends of the first surfaces and lower ends of the fourth surfaces.

7. The substrate transfer unit of claim 1, wherein upper parts of the expansion spaces are formed to be narrower than lower parts of the expansion spaces.

8. The substrate transfer unit of claim 1, wherein the main duct parts further include screens that face the through holes at the rear of the outlets, that extend from inner side surfaces of the main duct parts toward the front of the main duct parts, and that are bent such that spaces are formed between the screens and the through holes and that the width of the second flow paths is reduced, wherein a surface of each of the screens that guides the fluid in the main duct parts overlaps with an opening of the through holes.

9. The substrate transfer unit of claim 1, wherein the main duct parts are movable in the horizontal direction along the rail part, and immovable in the vertical direction along a body of the vertical part.

10. A substrate treatment apparatus comprising:

an index module;

one or more treatment modules into which a substrate is introduced from the index module to be treated; and a transfer module transferring the substrate between the treatment modules, wherein at least one of the index module and the transfer module includes a substrate transfer unit, and the substrate transfer unit includes comprises:

a rail part having a length in a horizontal direction a vertical part moving along the rail part, guiding the vertical movement of a robot, which transfers the substrate, and having, formed therein, first flow paths that a fluid is introduced into and passes through;

main duct parts having second flow paths formed therein that communicate with the first flow paths, having first end portions that are directly attached to the vertical part and that are inlets of the second flow paths that receive the fluid from the flow paths of the vertical part, having outlets that are formed at second end portions of the main duct parts and that face downward, and having through holes that are formed on one or both sides of each of the second end portions; and auxiliary duct parts surrounding the through holes at the second end portions of the main duct parts and having, formed therein, expansion spaces which communicate with the second flow paths.

11. The substrate treatment apparatus of claim 10, wherein the through holes are positioned at the rear of the outlets.

12. The substrate treatment apparatus of claim 10, wherein the substrate transfer unit is provided in the index module, exhaust holes, which communicate with the outlets of the main duct parts, are formed at the bottom surface of the index module, and the substrate treatment apparatus further comprises exhaust units, which are connected to the exhaust holes and forcibly discharge a fluid passing through the second flow paths.

13. The substrate treatment apparatus of claim 12, wherein the auxiliary duct parts include first surfaces, which are connected to the main duct parts and are provided at the rear of the auxiliary duct parts, second surfaces, which are connected to the main duct parts and are provided at the front of the auxiliary duct parts to face the first surfaces, third surfaces, which are connected to the main duct parts, connect the first surfaces and the second surfaces, and form top surfaces of the auxiliary duct parts, and fourth surfaces, which are connected to the first surfaces, the second surfaces, and the third surfaces and face the through holes, and openings, which face the third surfaces, are formed at lower parts of the auxiliary duct parts, adjacent to the outlets of the main duct parts.

14. The substrate treatment apparatus of claim 13, wherein the second end portions of the main duct parts include inclined surfaces, which are downwardly inclined from the rear to the front of the main duct parts to guide the movement of the fluid passing through the second flow paths in a downward direction, and the second surfaces form the same inclination as the inclined surfaces.

15. The substrate treatment apparatus of claim 13, wherein the first surfaces and the fourth surfaces of the auxiliary duct parts extend downwardly below lower ends of the main duct parts.

16. The substrate treatment apparatus of claim 15, wherein the auxiliary duct parts further include fifth surfaces, which extend downwardly from the second surfaces and have the same height at lower ends thereof as lower ends of the first surfaces and lower ends of the fourth surfaces.

17. The substrate treatment apparatus of claim 10, wherein upper parts of the expansion spaces are formed to be narrower than lower parts of the expansion spaces.

18. The substrate treatment apparatus of claim 17, wherein inclined plates, which face the through holes and are downwardly inclined in directions from the main duct parts to the auxiliary duct parts, are formed in the auxiliary duct parts.

19. The substrate treatment apparatus of claim 10, wherein the main duct parts further include screens, which face the through holes at the rear of the outlets, extend from inner side surfaces of the main duct parts toward the front of the main duct parts, and are bent such that spaces are formed between the screens and the through holes and that the width of the second flow paths is reduced.

20. A substrate transfer unit comprising:

a robot transferring a substrate;

a rail part having a length in a horizontal direction;

a vertical part moving along the rail part, guiding the vertical movement of the robot, having, formed therein, first flow paths that a fluid is introduced into and passes through, and having, provided therein, one or more fans which generate downward airflows;

main duct parts having:

second flow paths formed therein that communicate with the first flow paths, first end portions that are directly attached to the vertical part and that are inlets of the second flow paths that receive the fluid from the flow paths of the vertical part, outlets that are formed at second end portions of the main duct parts and that face downward, through holes that are formed on one or both sides of each of the second end portions, and screens that face the through holes at the rear of the outlets, that extend from inner side surfaces of the main duct parts toward the front of the main duct parts, and that are bent such that spaces are formed between the screens and the through holes and that the width of the second flow paths is reduced; and auxiliary duct parts surrounding the through holes at the second end portions of the main duct parts, having, formed therein, expansion spaces which communicate with the second flow paths, and having openings formed at lower parts thereof, adjacent to the outlets of the main duct parts, wherein the auxiliary duct parts include first surfaces, which are connected to the main duct parts and are provided at the rear of the auxiliary duct parts, second surfaces, which are connected to the main duct parts and are provided at the front of the auxiliary duct parts to face the first surfaces, third surfaces, which are connected to the main duct parts, connect the first surfaces and the second surfaces, and form top surfaces of the auxiliary duct parts, fourth surfaces, which are connected to the first surfaces, the second surfaces, and the third surfaces and face the through holes, and inclined plates, which face the through holes and are downwardly inclined in directions from the main duct parts to the auxiliary duct parts, and the first surfaces and the fourth surfaces of the auxiliary duct parts extend downwardly below lower ends of the main duct parts.

* * * * *